(12) United States Patent
Khater et al.

(10) Patent No.: US 7,002,221 B2
(45) Date of Patent: Feb. 21, 2006

(54) BIPOLAR TRANSISTOR HAVING RAISED EXTRINSIC BASE WITH SELECTABLE SELF-ALIGNMENT AND METHODS OF FORMING SAME

(75) Inventors: Marwan H. Khater, Poughkeepsie, NY (US); James S. Dunn, Jericho, VT (US); David L. Harame, Essex Junction, VT (US); Alvin J. Joseph, Williston, VT (US); Qizhi Liu, Essex Junction, VT (US); Francois Pagette, Fishkill, NY (US); Stephen A. St. Onge, Colchester, VT (US); Andreas D. Stricker, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,988

(22) Filed: Aug. 29, 2003

(65) Prior Publication Data

US 2005/0048735 A1    Mar. 3, 2005

(51) Int. Cl.
*H01L 23/62*    (2006.01)
(52) U.S. Cl. .................. 257/360; 257/561; 257/577
(58) Field of Classification Search .............. 257/360, 257/536, 560, 561, 563, 564, 577
See application file for complete search history.

(56) References Cited

U.S. PATENT DOCUMENTS

| | | | |
|---|---|---|---|
| 4,392,149 A * | 7/1983 | Horng et al. ............... 257/518 |
| 5,128,271 A | 7/1992 | Bronner et al. | |
| 5,494,836 A | 2/1996 | Imai | |
| 5,506,157 A * | 4/1996 | Lee et al. .................. 438/348 |
| 5,506,427 A | 4/1996 | Imai | |
| 5,541,121 A * | 7/1996 | Johnson ...................... 438/350 |
| 5,599,723 A | 2/1997 | Sato | |
| 5,606,195 A * | 2/1997 | Hooper et al. .............. 257/488 |
| 5,648,280 A | 7/1997 | Kato | |
| 5,656,514 A | 8/1997 | Ahlgren et al. | |
| 5,668,396 A | 9/1997 | Sato | |
| 5,723,378 A | 3/1998 | Sato | |
| 5,766,999 A | 6/1998 | Sato | |
| 5,789,800 A | 8/1998 | Kohno | |
| 5,798,561 A | 8/1998 | Sato | |

(Continued)

OTHER PUBLICATIONS

IEEE Electron Device Letters, vol. 23, No. 5, May 2002, "Self-Aligned SiGe NPN Transistors With 285 GHz FMAX and 207 GHz fT in a Manufacturable Technology", Jagannathan et al., pp. 258-260.

(Continued)

*Primary Examiner*—Phuc T. Dang
(74) *Attorney, Agent, or Firm*—Lisa U. Jaklitsch

(57) ABSTRACT

A bipolar transistor with raised extrinsic base and selectable self-alignment between the extrinsic base and the emitter is disclosed. The fabrication method may include the formation of a predefined thickness of a first extrinsic base layer of polysilicon or silicon on an intrinsic base. A dielectric landing pad is then formed by lithography on the first extrinsic base layer. Next, a second extrinsic base layer of polysilicon or silicon is formed on top of the dielectric landing pad to finalize the raised extrinsic base total thickness. An emitter opening is formed using lithography and RIE, where the second extrinsic base layer is etched stopping on the dielectric landing pad. The degree of self-alignment between the emitter and the raised extrinsic base is achieved by selecting the first extrinsic base layer thickness, the dielectric landing pad width, and the spacer width.

17 Claims, 13 Drawing Sheets

U.S. PATENT DOCUMENTS

| | | |
|---|---|---|
| 5,821,149 A | 10/1998 | Schuppen et al. |
| 5,834,800 A | 11/1998 | Jalali-Farahani et al. |
| 5,846,869 A | 12/1998 | Hashimoto et al. |
| 5,962,880 A | 10/1999 | Oda et al. |
| 6,121,101 A | 9/2000 | King et al. |
| 6,281,097 B1 | 8/2001 | Aoyama |
| 6,287,929 B1 | 9/2001 | Kato |
| 6,329,698 B1 | 12/2001 | Koscielniak et al. |
| 6,337,251 B1 | 1/2002 | Hashimoto |
| 6,346,453 B1 | 2/2002 | Kovacic et al. |
| 6,380,017 B1 | 4/2002 | Darwish et al. |
| 6,383,855 B1 | 5/2002 | Gao et al. |
| 6,388,307 B1 | 5/2002 | Kondo et al. |
| 6,400,204 B1 * | 6/2002 | Davis ................ 327/314 |
| 6,716,761 B1 * | 4/2004 | Mitsuiki ............ 438/706 |
| 6,809,024 B1 | 10/2004 | Dunn et al. |

OTHER PUBLICATIONS

IEEE International Electron Device Meeting Technical Digest, 771 (2002), "SiGe HBTs with Cut-off Frequency of 350 Ghz," Rich et al., pp. 1-4.

* cited by examiner

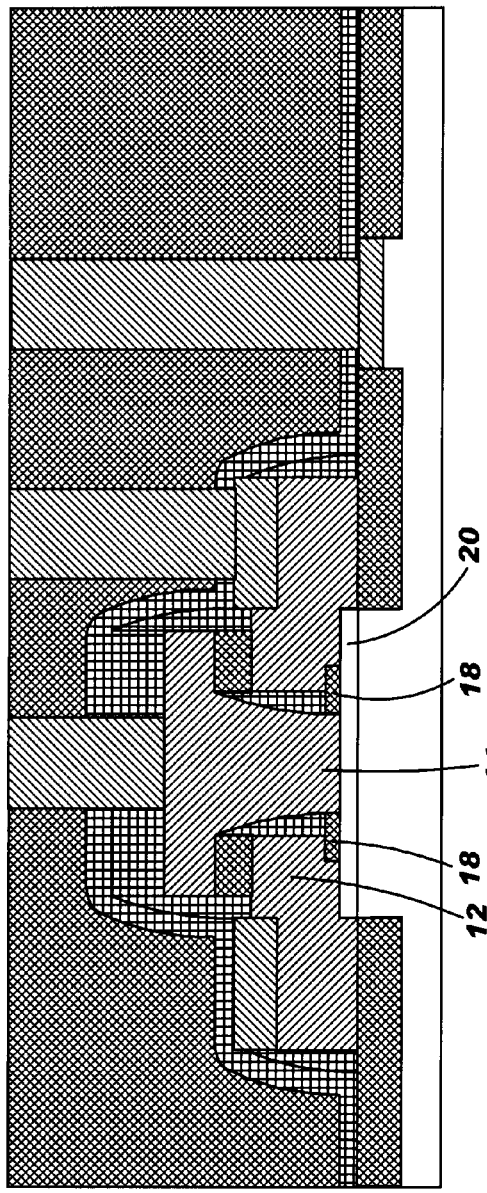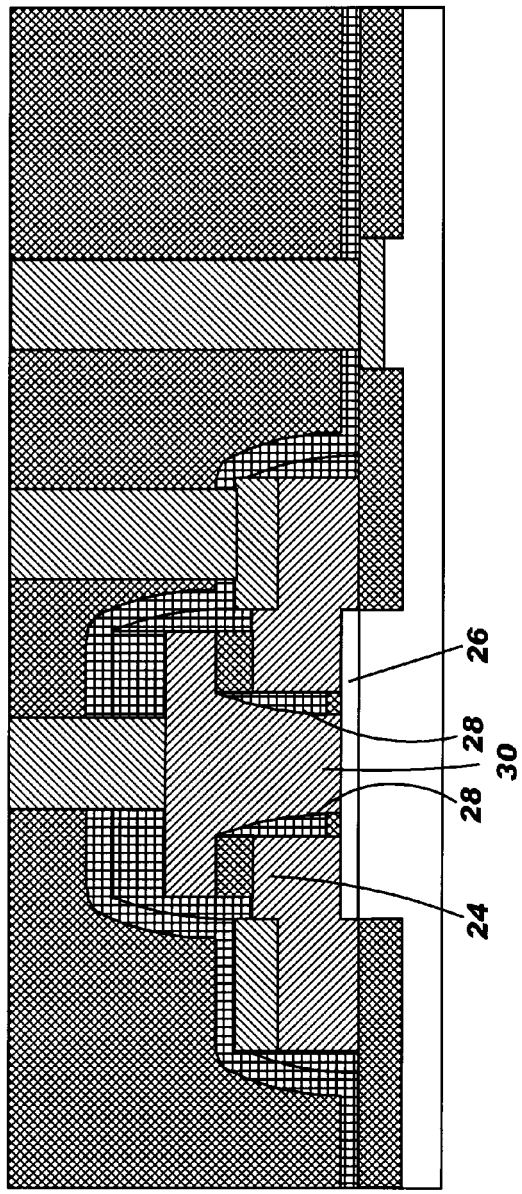
FIG. 1A (Prior Art)
FIG. 1B (Prior Art)

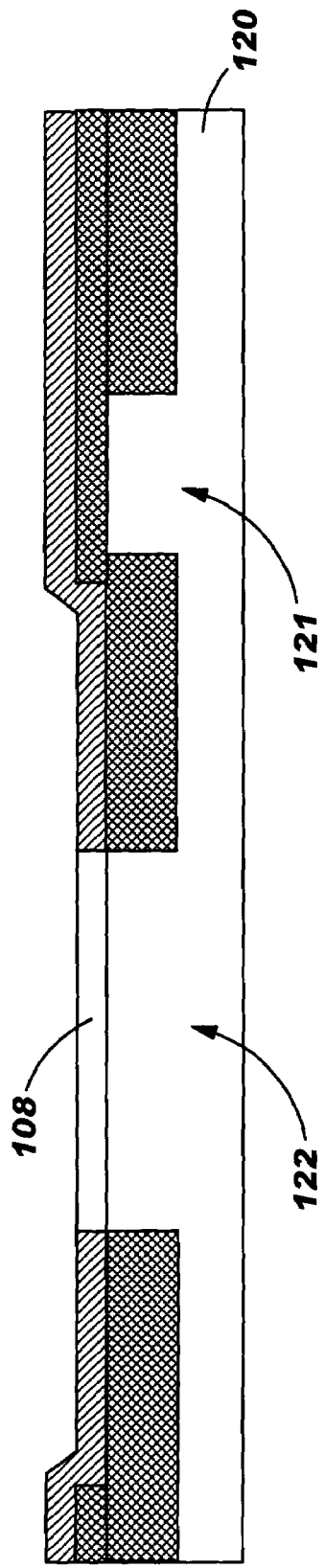
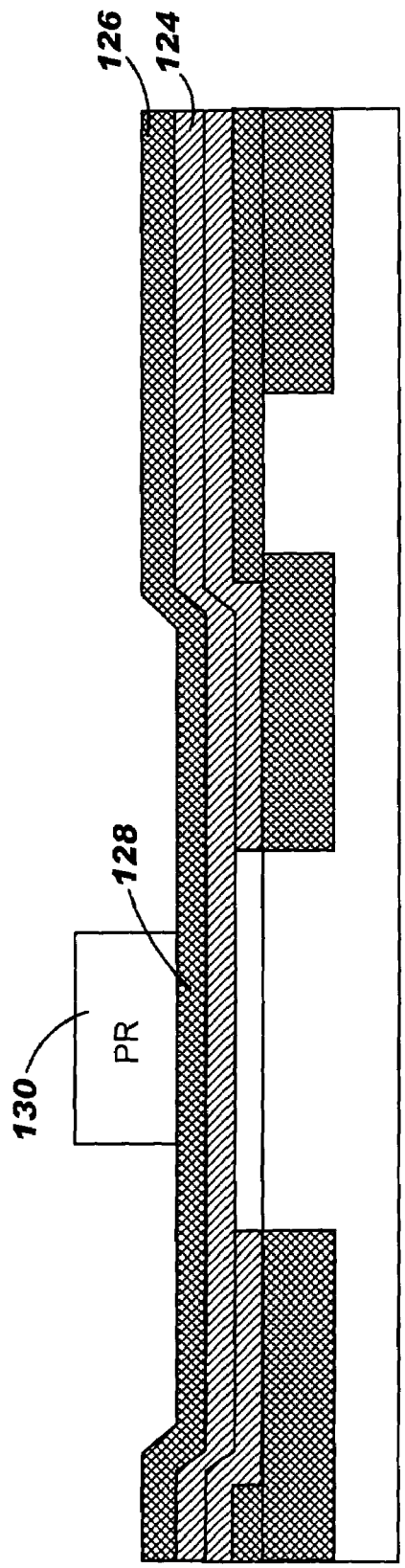
FIG. 3A
FIG. 3B

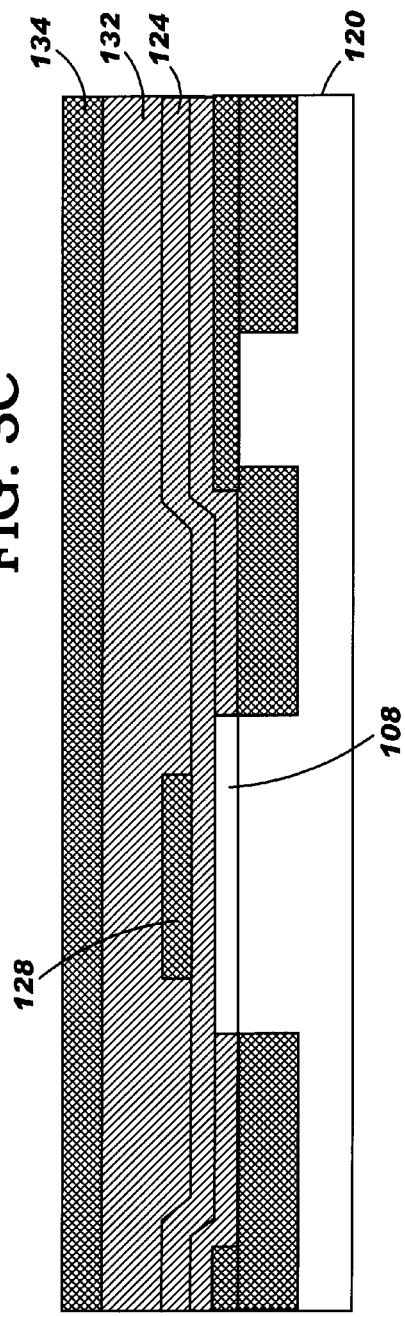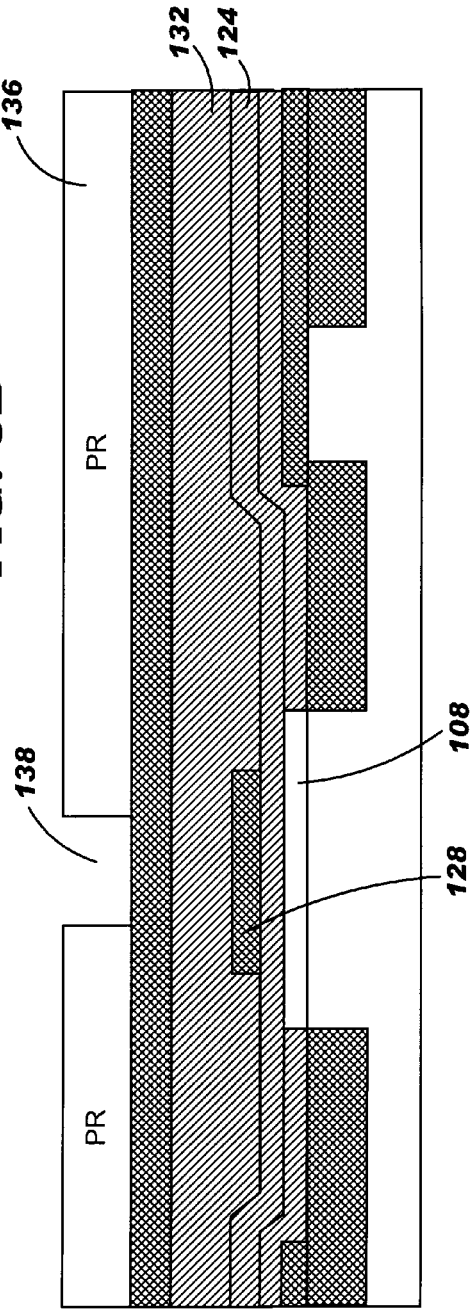

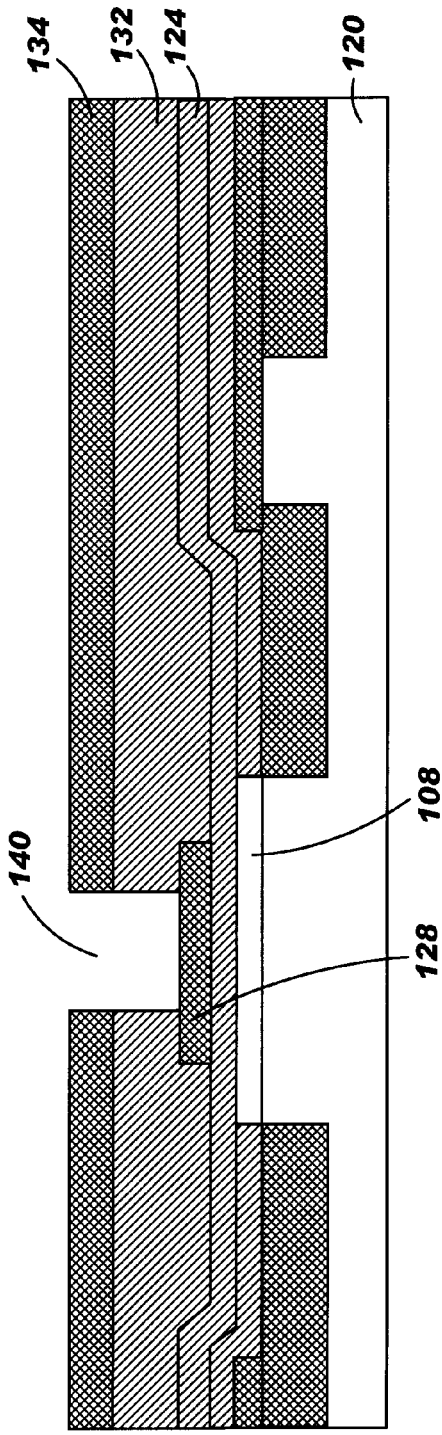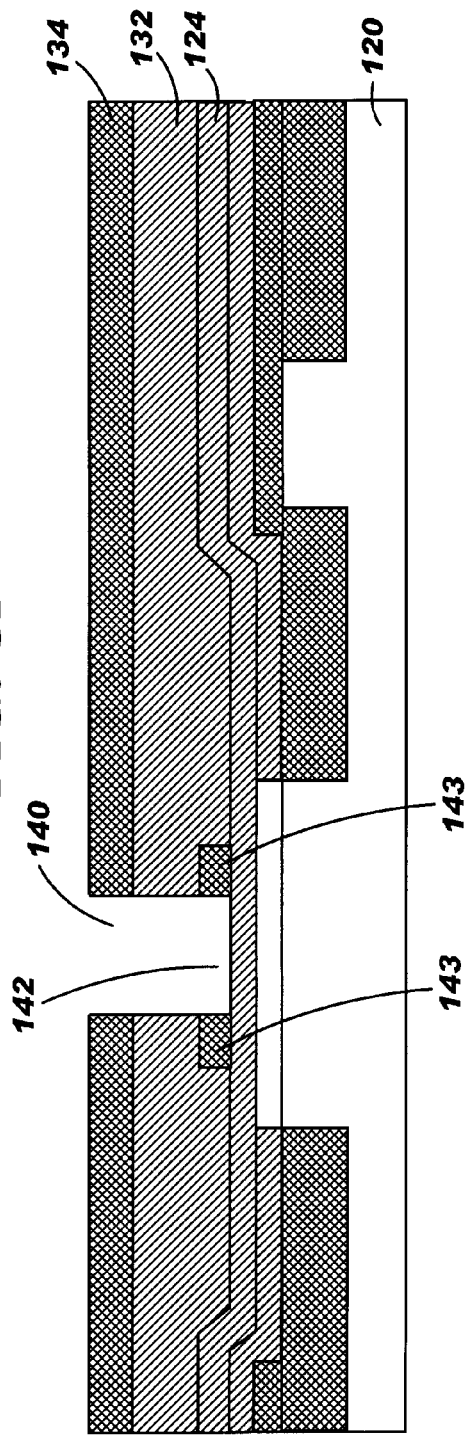

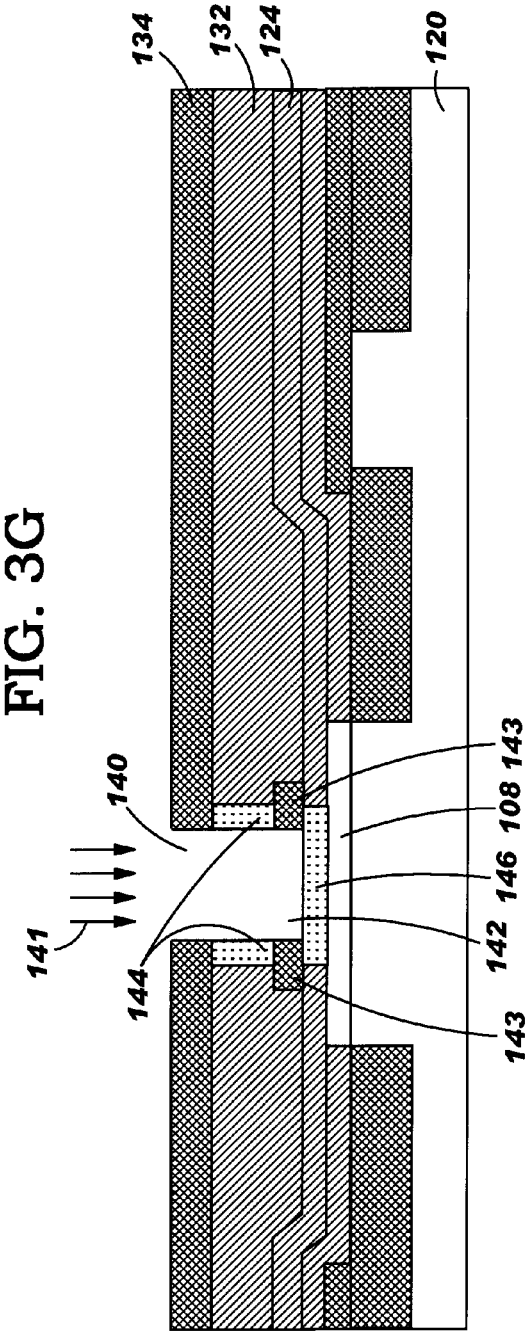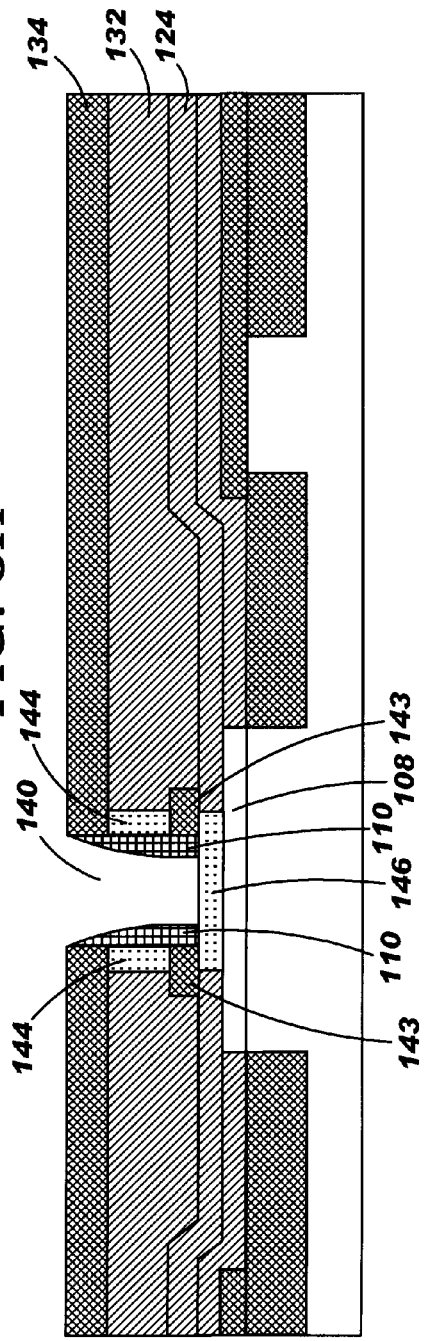

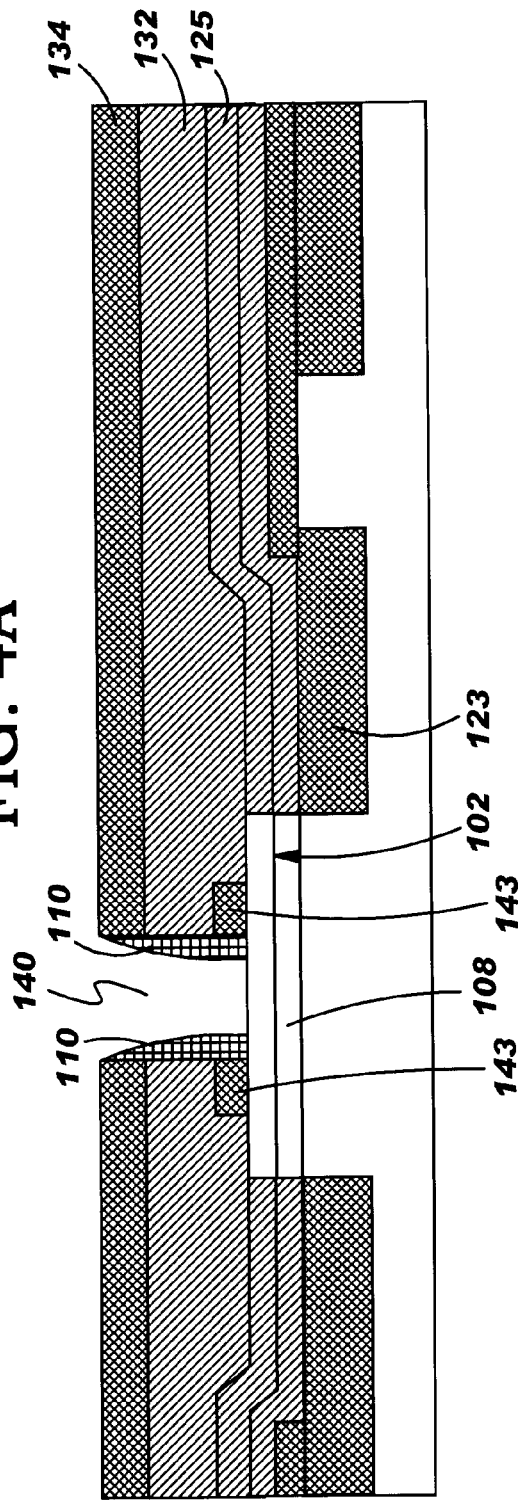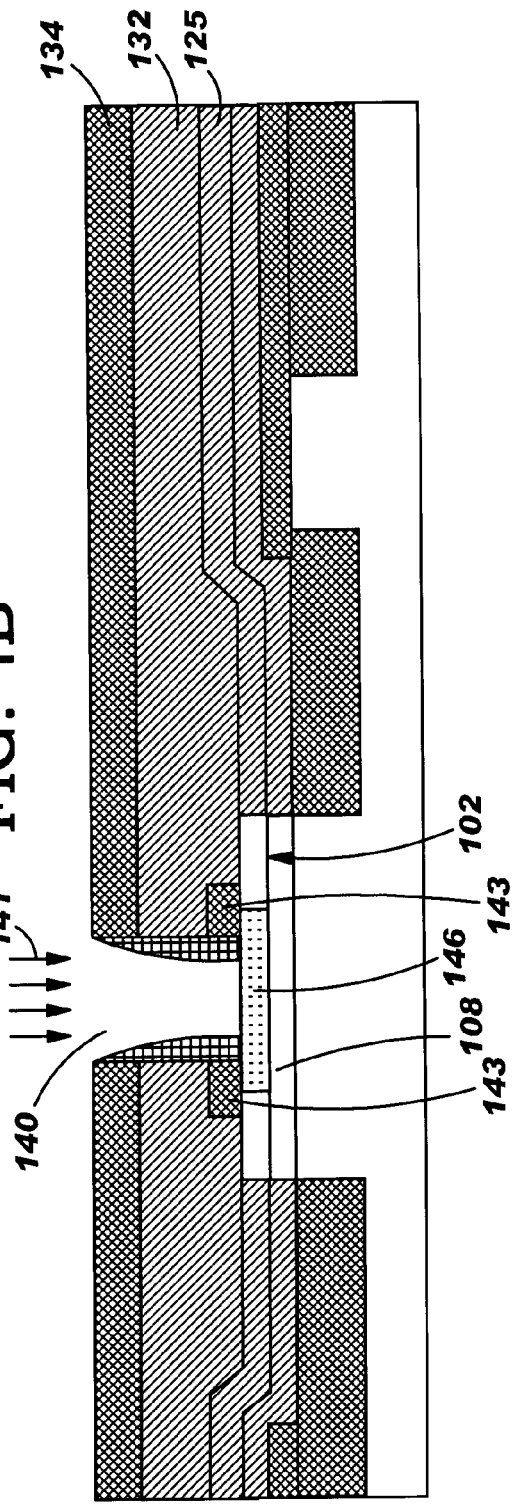

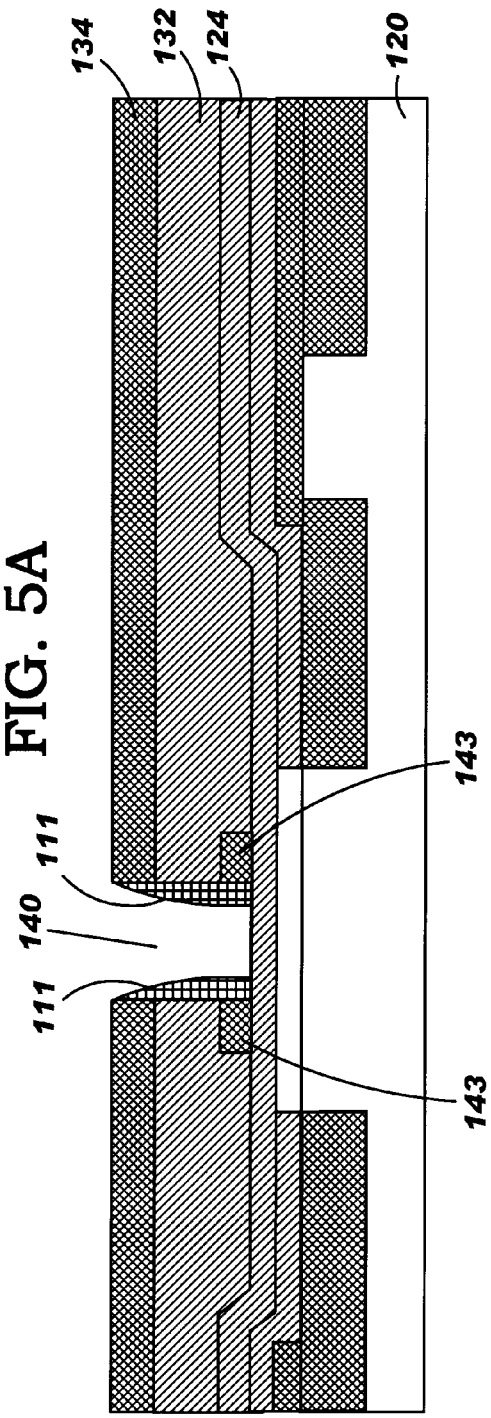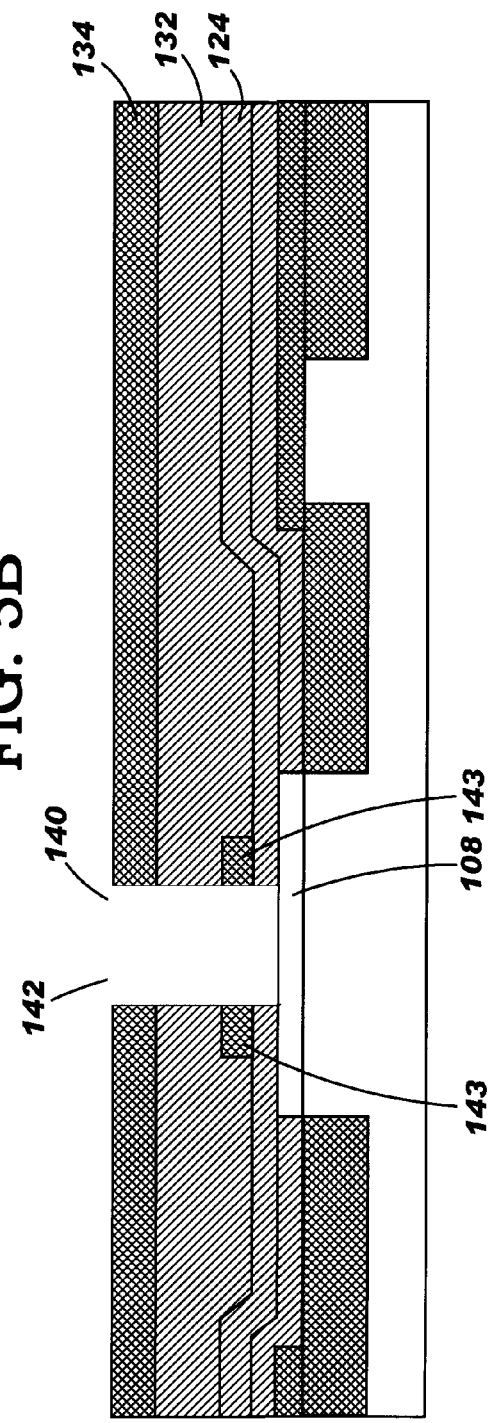

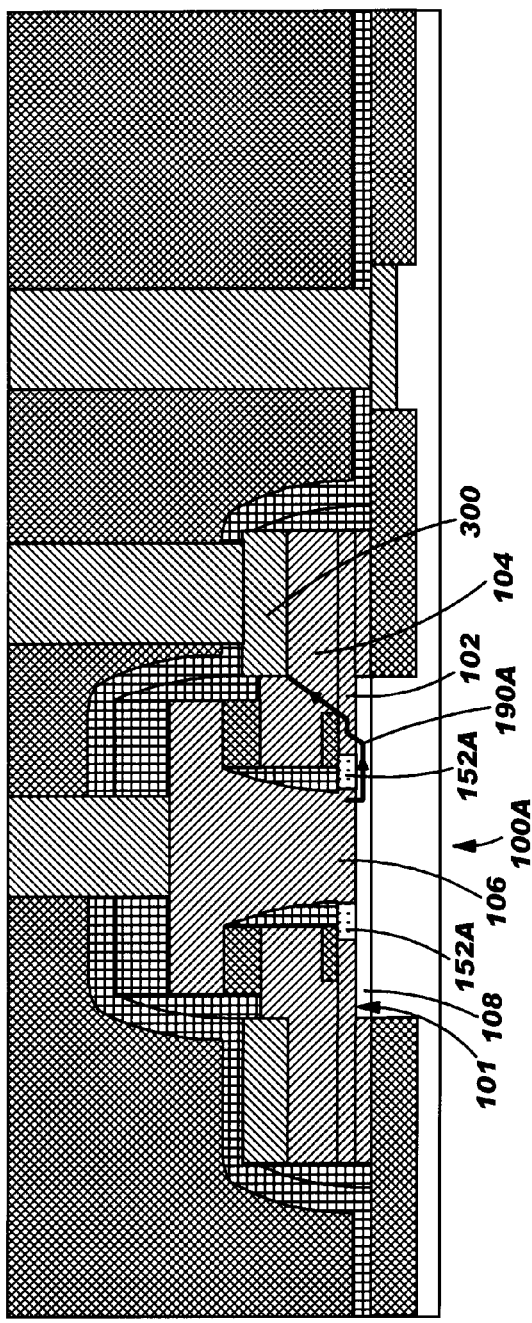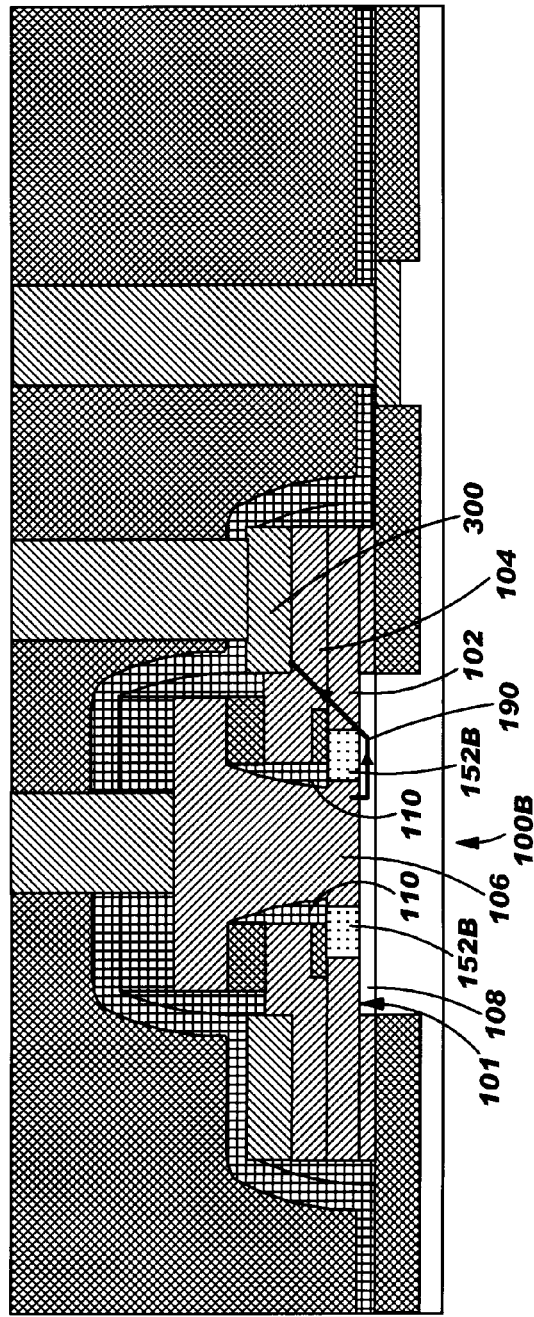

US 7,002,221 B2

BIPOLAR TRANSISTOR HAVING RAISED EXTRINSIC BASE WITH SELECTABLE SELF-ALIGNMENT AND METHODS OF FORMING SAME

BACKGROUND OF INVENTION

1. Technical Field

The present invention relates generally to a bipolar transistor, and more particularly, to a bipolar transistor having a raised extrinsic base with selectable self-alignment and methods of forming the transistor.

2. Related Art

Bipolar transistors with Silicon-Germanium (SiGe) intrinsic base are the focus of integrated circuits fabricated for high performance mixed signal applications. The emitter to collector transit time of such a transistor is reduced by optimizing the Ge/Si ratio, doping profile, and film thickness of the epitaxy grown intrinsic SiGe base. The first developed bipolar transistors to take advantage of the SiGe intrinsic base had an extrinsic base formed by implantation of the silicon substrate. The performance of such transistors reached a limit as the emitter dimension is reduced due to loss of intrinsic base definition caused by the lateral diffusion of the extrinsic base dopants. To achieve higher electrical performance, the transistors must have a doped polysilicon extrinsic base layer on top of the epitaxy grown intrinsic SiGe base, i.e., a raised extrinsic base. Transistors with a raised extrinsic base on top of a SiGe intrinsic base have demonstrated the highest cutoff frequency (Ft) and maximum oscillation frequency (Fmax) to date. See B. Jagannathan et. al., "Self-aligned SiGe NPN transistors with 285 GHz $f_{MAX}$ and 207 GHz $f_T$ in a manufacturable technology," IEEE Electron Device Letters 23, 258 (2002) and J.-S. Rieh et. al., "SiGe HBTs with cut-off frequency of 350 GHz," International Electron Device Meeting Technical Digest, 771 (2002).

FIG. 1A shows a prior art non-self aligned bipolar transistor 10 with polysilicon raised extrinsic base 12 formed by a simple method. In this case, an emitter 14 opening is formed with RIE etch through the oxide/polysilicon stack and stops on a dielectric layer (e.g. oxide) landing pad 18. Landing pad 18 is formed and defined with a lithography step prior to the deposition of the oxide/polysilicon stack. Fmax of such a non-self aligned transistor is limited by a base resistance (Rb) caused by the large spacing between the emitter 14 and extrinsic base 12 in intrinsic base 20. As can be seen in FIG. 1A, this spacing is determined by a remaining portion of the dielectric etch stop layer (or landing pad 18), which may be non-symmetric around emitter 14 due to lithography alignment tolerance.

To minimize base resistance Rb and achieve a high Fmax, the emitter and the extrinsic base polysilicon must be in close proximity. Such structure is shown in FIG. 1B as a prior art self-aligned bipolar transistor 22 with polysilicon raised extrinsic base 24 and a SiGe intrinsic base 26. Transistor 22 is self-aligned, i.e., the spacing between extrinsic base 24 polysilicon and an emitter 30 polysilicon is determined by a sidewall spacer 28 rather than by lithography. A few different methods of forming a self-aligned bipolar transistor with raised polysilicon extrinsic base have been documented. U.S. Pat. Nos. 5,128,271 and 6,346,453 describe approaches in which the extrinsic base polysilicon over a pre-defined sacrificial emitter is planarized by chemical mechanical polishing (CMP). In these approaches, a dishing effect of the CMP process can lead to a significant difference in the extrinsic base layer thickness between small and large devices, as well as between isolated and nested devices. In other approaches described in U.S. Pat. Nos. 5,494,836, 5,506,427, and 5,962,880, an intrinsic base is grown using selective epitaxy inside an emitter opening and an undercut formed under the extrinsic base polysilicon. In these approaches, the self-alignment of the extrinsic base is achieved with the epitaxial growth inside the undercut. Special techniques are required to ensure a good link-up contact between the intrinsic base and the extrinsic base. Each of the approaches described above has significant process and manufacturing complexity.

In view of the foregoing, there is a need in the art for an improved bipolar transistor with a SiGe intrinsic base and with a raised extrinsic base in close proximity to the emitter, and a method of fabricating such a transistor that does not suffer from the problems of the related art.

SUMMARY OF INVENTION

A bipolar transistor with raised extrinsic base and selectable self-alignment between the extrinsic base and the emitter is disclosed. The fabrication method may include the formation of a predefined thickness of a first extrinsic base layer of polysilicon or silicon on an intrinsic base. A dielectric landing pad is then formed by lithography on the first extrinsic base layer. Next, a second extrinsic base layer of polysilicon or silicon is formed on top of the dielectric landing pad to finalize the raised extrinsic base total thickness. An emitter opening is formed using lithography and RIE, where the second extrinsic base layer is etched stopping on the dielectric landing pad. The predefined thickness of the first extrinsic base layer is used to distance the landing pad away from the intrinsic base, which allows the extrinsic base to emitter spacing to be determined by an oxide section formed in the first extrinsic base layer. The degree of self-alignment between the emitter and the raised extrinsic base can be achieved by selecting the first extrinsic base layer thickness, the dielectric landing pad width, and the spacer width. In other words, the first extrinsic base layer thickness determines the lateral extent of the oxidation or wet etch of silicon below the remaining portion of the dielectric landing pad, which in turn determines the spacing between the emitter edge and the raised extrinsic base edge. The base resistance and the performance (i.e., Fmax) of the resulting transistor may be selected anywhere between that of a non-self-aligned and that of a self-aligned transistor having a raised extrinsic base.

A first aspect of the invention is directed to a method of fabricating a transistor, the method comprising the steps of: forming an emitter landing pad over a first extrinsic base layer, the first extrinsic base layer being above an intrinsic base; forming an opening to the first extrinsic base layer, the opening generating a remaining portion of the landing pad to a side of the opening; oxidizing to form an oxide region in a portion of the first extrinsic base layer, the oxide region including an oxide section extending below a portion of the remaining portion; removing the oxide region within the opening and leaving the oxide section; and using the oxide section to determine a spacing between an emitter formed in the opening and the first extrinsic base layer.

A second aspect of the invention is directed to a transistor comprising: a remaining portion of an emitter landing pad that is distanced from an intrinsic base.

A third aspect of the invention is directed to a transistor comprising: an emitter; a first extrinsic base layer; a second extrinsic base layer electrically connected to the first extrinsic base layer; an oxide section in the first extrinsic base layer adjacent the emitter; and a remaining portion of an emitter landing pad that separates each of the first and second extrinsic base layer from one another adjacent the emitter.

A fourth aspect of the invention is directed to a transistor comprising: an emitter extending through a remaining portion of an emitter landing pad to an intrinsic base; and an oxide section in an extrinsic base layer, the oxide portion extending below a part of the remaining portion, wherein a width of the oxide section determines an amount of base resistance.

A fifth aspect of the invention is directed to a method of fabricating a transistor, the method comprising the steps of: embedding an emitter landing pad in an extrinsic base such that the emitter landing pad is distanced from an intrinsic base; forming an opening through the emitter landing pad leaving a remaining portion of the emitter landing pad; forming an oxide section below the remaining portion; and forming an emitter in the opening such that the emitter extends to the intrinsic base.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein:

FIG. 1A shows a prior art non-self aligned transistor.

FIG. 1B shows a prior art fully self-aligned transistor.

FIGS. 3A–3I show a process to form the transistor of FIG. 2.

FIGS. 4A–4D shows steps of an alternative of the process shown in FIGS. 3A–3I to form an alternate embodiment transistor as shown in FIG. 4D.

FIGS. 5A–5E shows steps of an alternative of the process shown in FIGS. 3A–3I to form an alternate embodiment transistor as shown in FIG. 5E.

FIGS. 6A–6B illustrate advantages of the selectable self-alignment feature of the invention.

DETAILED DESCRIPTION

Figure 2:
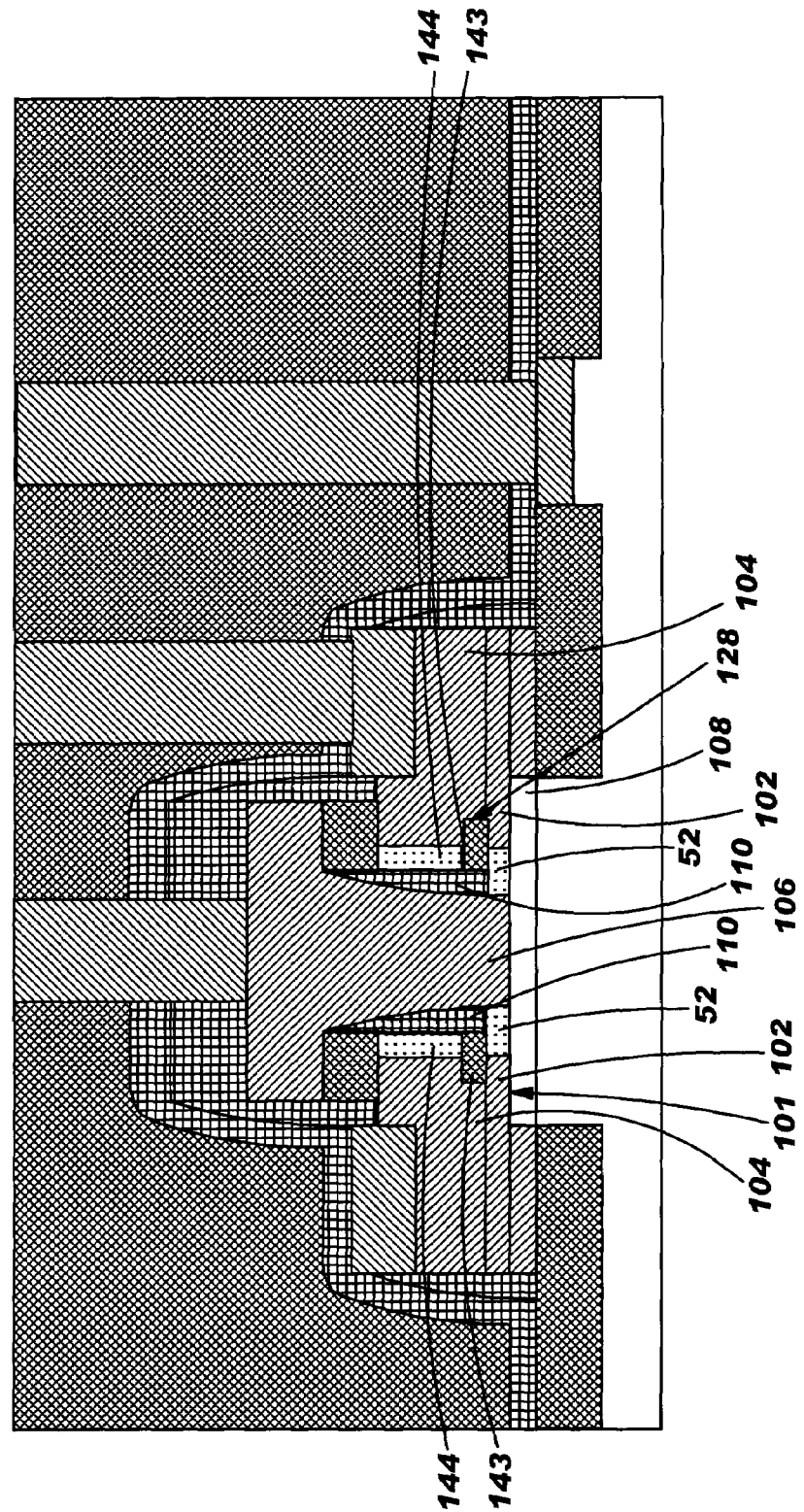
FIG. 2 shows a transistor including a raised extrinsic base formed according to the invention.

Referring to FIG. 2, a transistor 100 (hereinafter "transistor 100") having a raised extrinsic base 101 including a first extrinsic base layer 102 and a second extrinsic base layer 104, an emitter 106 and an intrinsic base 108 is illustrated. According to the invention, first extrinsic base layer 102 thickness can be varied to select the self-alignment between emitter 106 and extrinsic base 101 to be anywhere between non-self aligned and self-aligned. That is, transistor 100 may be selectively constructed such that it may be considered non-self aligned, self-aligned or somewhere in between, despite being generated mainly by traditional non-self aligned techniques as will be further explained relative to the following description, and in particular, FIGS. 6A–6B.

Second extrinsic base layer 104 (hereinafter "second layer" 104) is positioned atop first extrinsic base layer 102 (hereinafter "first layer" 102), and is electrically connected thereto. First and second extrinsic base layers 102, 104 may extend in a horizontally overlapped fashion from emitter 106 to a common edge. First layer 102 has a first doping concentration and second layer 104 has a second doping concentration. In one embodiment, the second doping concentration of second layer 104 polysilicon (or silicon) is different than the first doping concentration of the first layer 102 polysilicon (or silicon). Alternatively, the doping concentrations may be the same, however, having different dopant concentrations allows for improved device performance. An intrinsic base 108 is shown below first layer 102 and emitter 106. Transistor 100 also includes a remaining portion 143 of a landing pad 128 that is distanced from (i.e., elevated from) intrinsic base 108 by first layer 102. Emitter 106 extends through remaining portion 143 to intrinsic base 108. First layer 102 includes an oxide section 52 that is positioned below a part of remaining portion 143, i.e., lower than and either to or under a part of remaining portion 143, and adjacent emitter 106. Remaining portion 143 separates each of the first and second extrinsic base layer 102, 104 from one another adjacent emitter 106. A size (width) of oxide section 52 determines an amount of self-alignment of transistor 100. In particular, the size of oxide section 52 determines a distance or spacing between emitter 106 and extrinsic base 101, and accordingly is important in determining a base resistance Rb. Transistor 100 also includes a spacer 110 and an oxide region 144 between emitter 106 and second layer 104.

Figure 3I:
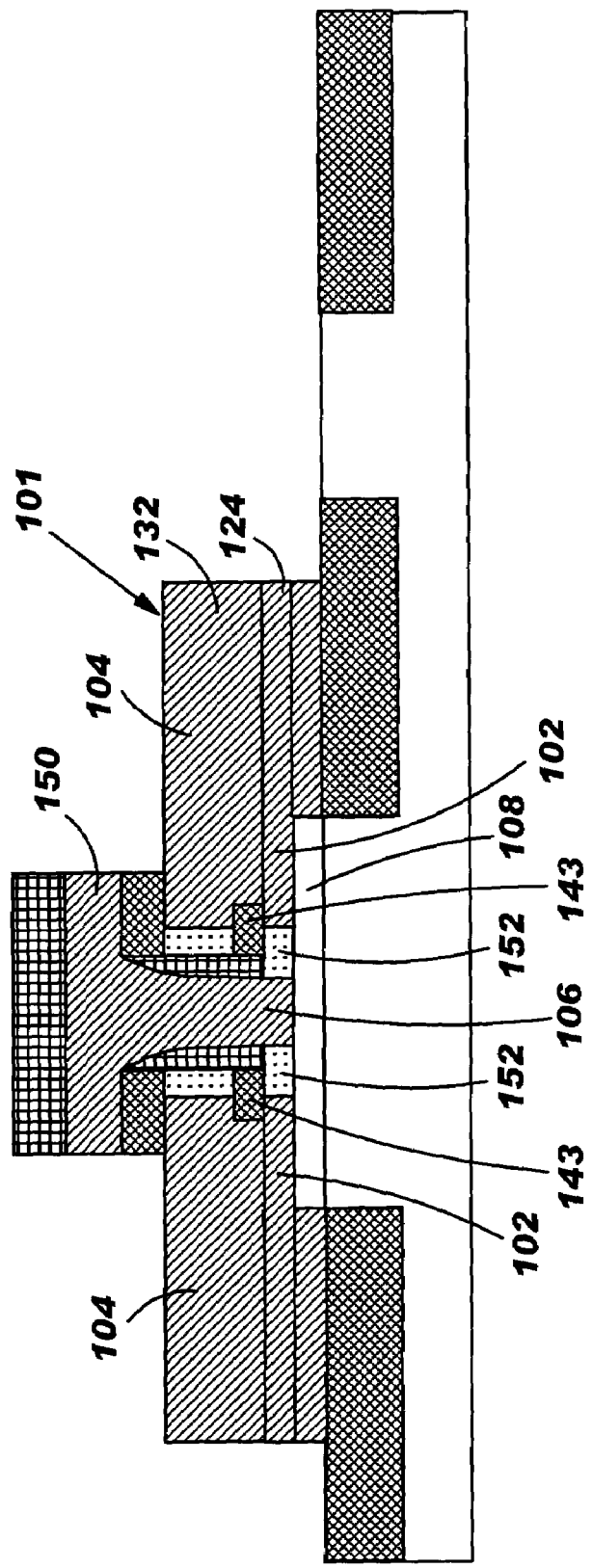

Referring to FIGS. 3A–3I, a first embodiment of a process to form transistor 100 (FIG. 2) will now be described. Referring to FIG. 3A, a substrate 120 of, for example, crystalline silicon is preliminarily provided. Substrate 120 has a collector region 122 and a collector reachthrough region 121 to provide contact to collector region 122. Substrate 120 also includes intrinsic base 108 formed therein, for example, by a contemporaneous epitaxy process or subsequent implantation. Other structure shown in FIG. 3A includes the required trench dielectric, shallow trench dielectric, sub-collector and collector implants, which are generated in a conventional fashion. Since these structures are not relevant to the inventive process, they will not be discussed further.

FIG. 3B shows initial steps of the process including depositing a first polysilicon layer 124, which will eventually form first layer 102 (FIG. 2). First polysilicon layer 124 is preferably deposited as a doped polysilicon, however, the polysilicon may alternatively be deposited and then doped in any known fashion. First polysilicon layer 124 is deposited at a predefined thickness, which as will become evident below, determines the amount of self-alignment of the resulting transistor. Next, a first dielectric layer 126 is deposited. First dielectric layer 126 may be made of any now known or later developed dielectric material such as silicon dioxide, silicon nitride, etc. Each layer 124, 126 is deposited at least over intrinsic base 108. FIG. 3B also shows the initial step of forming landing pad 128 from first dielectric layer 126 using lithography. In particular, a photoresist 130 may be deposited, exposed and developed. Etching may then proceed to remove first dielectric layer 126 outside of photoresist 130 to leave landing pad 128 as shown in FIG. 3C. As a result of the above processing, landing pad 128 is distanced from (or raised) from intrinsic base 108.

FIG. 3C also shows depositing a second polysilicon layer 132 and a second dielectric layer 134. Second polysilicon layer 132 will eventually form second layer 104 (FIG. 2) that together with first layer 102 (FIG. 2) make up the thickness of entire extrinsic base 101 (FIG. 2). Second polysilicon layer 132 is preferably deposited as a doped polysilicon, however, the polysilicon may alternatively be deposited and then doped in any known fashion. As noted above, first polysilicon layer 124 and second polysilicon layer 132 may be the same or different. In one embodiment, first polysilicon layer 124 includes more dopant than second polysilicon layer 132, which allows for improved device performance. The provision of second polysilicon layer 132 causes landing pad 128 to be embedded in polysilicon layers 124 and 132, i.e., extrinsic base 101. Dielectric layer 134 may be made of any now known or later developed dielectric material such as silicon oxide, silicon nitride, etc.

As shown in FIG. 3D, a photoresist 136 is deposited, exposed and developed to include a mask opening 138. FIG. 3E shows formation of an opening 140 using lithography, i.e., by using photoresist 136 and etching. Opening 140 extends through second dielectric layer 134 and second polysilicon layer 132, and stops on landing pad 128. Opening 140 is smaller than landing pad 128. FIG. 3F shows further etching through the exposed part of landing pad 128 in opening 140 to form a pad opening 142 that exposes first polysilicon layer 124 above intrinsic base 108. Etching may occur in the form of wet etching or selective RIE to first polysilicon layer 124. The etching leaves remaining portion 143 of the landing pad surrounded by first polysilicon layer 124 and second polysilicon layer 132.

FIG. 3G shows an isotropic oxidation step within opening 140 to convert exposed polysilicon areas to oxide. In particular, oxidation forms an oxide region 144 to a side of opening 140 and an oxide region 146 in a portion of first polysilicon layer 124. Oxide region 144 extends between second dielectric layer 134 to remaining portion 143 of the landing pad. Oxide region 146 extends the width of pad opening 142 and below a part of remaining portion 143 of the landing pad, i.e., lower than and to or under remaining portion 143. Oxidation is sufficient to ensure that oxide region 146 prevents contact of first layer 102 polysilicon with emitter 106 (FIG. 2) that will eventually be provided in opening 140. The thickness and width of oxide region 146 is determined by the predefined thickness of first polysilicon 124. In one embodiment, oxidation is provided as a high-pressure oxidation; however, oxidation may be provided by other types of oxidation process(es).

As shown in FIG. 3H, the next step includes formation of a spacer 110 to the side of opening 140 in any now known or later developed fashion, e.g., deposition and etch back of silicon nitride, with the etching stopping on oxide region 146. Spacer 110 narrows the size of opening 140. Referring to FIG. 3I, oxide region 146 is removed within opening 140 to leave an oxide section 152. Removal may be made by, for example, wet etching. Next, emitter polysilicon 150 is deposited and oxide section 152 is used to determine the spacing between extrinsic base 101 (i.e., first layer 102) and emitter 106. FIG. 3I also shows structure after further steps toward completion of transistor 100 (FIG. 2). It should be recognized that the subsequent processing shown in FIG. 3I is merely illustrative and that other processing may be provided to form emitter 106 or otherwise finalize transistor 100 (FIG. 2).

Figure 4C:
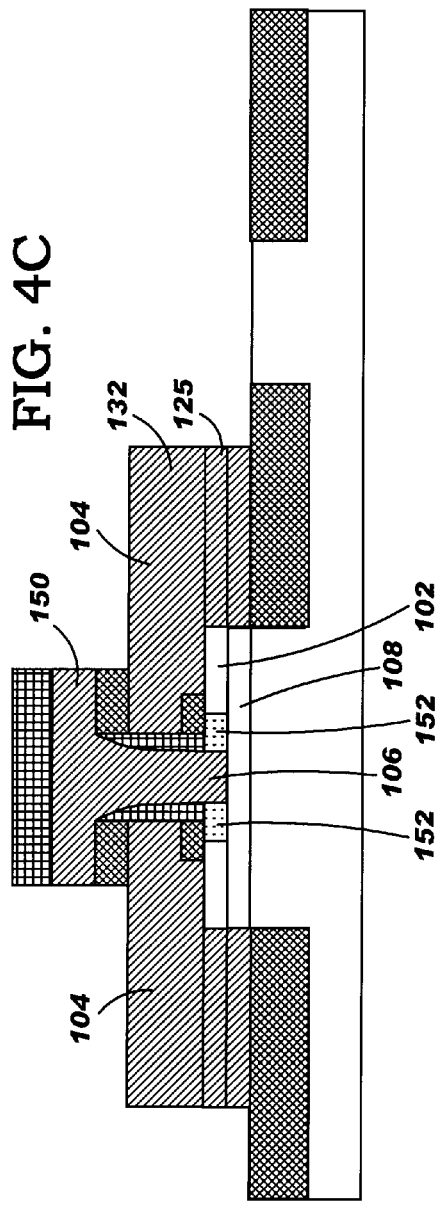

Referring to FIGS. 4A–4D, an alternative embodiment for some of the steps of the above process is illustrated. One alternative step, shown in FIG. 4A, includes an alternative manner of forming first layer 102 after formation of intrinsic base 108. In particular, during epitaxial growth of a doped SiGe intrinsic base 108, the germanium (Ge) may be turned off such that epitaxial growth continues to form doped first layer 125 to the predefined thickness. In this case, first layer 125 grows as doped crystalline silicon over SiGe intrinsic base 108 and doped polysilicon elsewhere. An advantage of this alternative step is that first layer 125 may be formed in the same chamber in which the epitaxial SiGe growth takes place. The result is an improved interface between first layer 102 and intrinsic base 108. Another advantage of this alternative step is that the crystalline silicon of first layer 102 over intrinsic base 108 and in between shallow isolation trench 123 has a lower resistance than first polysilicon layer 124 (FIGS. 3B–3I) in transistor structure in FIG. 2, which improves device performance. As before, first layer 102 may include a first dopant concentration and second layer 104 may include a second dopant concentration. The first and second dopant concentration may be the same or different. In one embodiment, first layer 102 includes more dopant than second layer 104. Having different dopant concentration allows for improved device performance. FIG. 4A also shows the subsequent formation of the raised landing pad, deposition of a second polysilicon layer 132 and second dielectric layer 134, and formation of emitter opening 140 to form remaining portion 143 of the landing pad.

FIG. 4A also shows another alternative step in that spacer 110 may be generated prior to isotropic oxidation 141, shown in FIG. 4B. Spacer 110 narrows opening 140. In this case, oxidation does not occur on the sidewall of opening 140, and only oxide region 146 is formed in first layer 102. Oxide region 146 extends the width of opening 140 and below a part of remaining portion 143 of the landing pad, i.e., lower than and either to or under remaining portion 143.

Figure 4D:
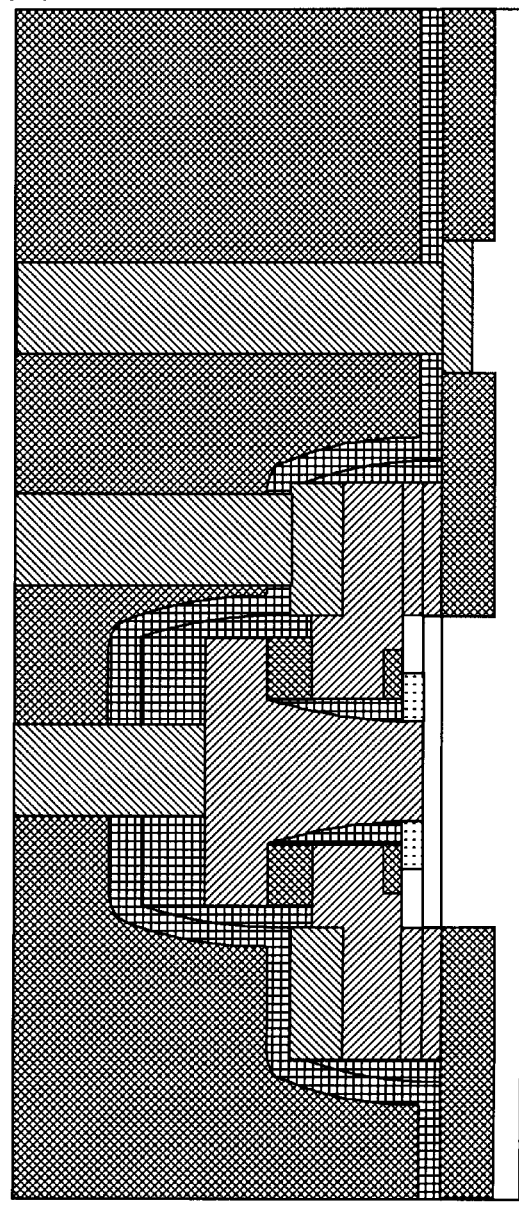

FIG. 4C shows oxide region 146 removed within the opening by wet etching to leave oxide section 152. Next, as before, emitter polysilicon 150 is deposited and oxide section 152 determines the spacing between the extrinsic base 101 (i.e., first layer 102) and emitter 106. FIG. 4C also shows structure after further steps toward completion of transistor 200 as shown in FIG. 4D. It should be recognized that the subsequent processing shown in FIGS. 4C and 4D is merely illustrative and that other processing may be provided to form emitter 106 or otherwise finalize transistor 200.

Figure 5C:
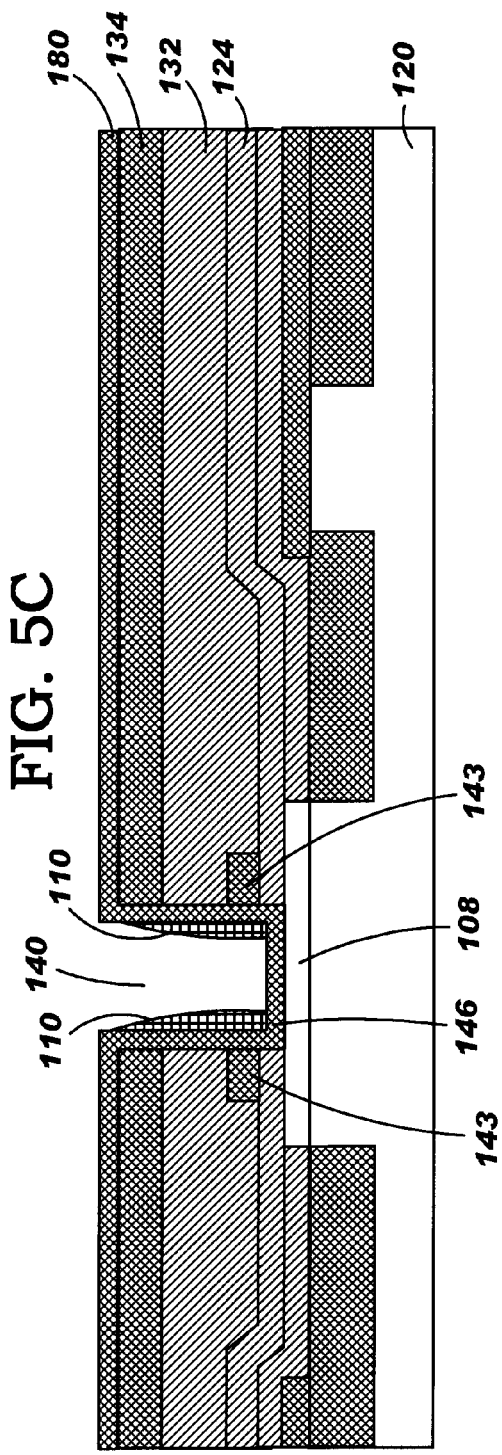

Referring to FIGS. 5A–5E, another alternative embodiment for some of the steps of the above process is illustrated. FIG. 5A shows formation of an opening 140 using lithography, i.e., by using photoresist (not shown) and etching. In one embodiment, opening 140 extends through second dielectric layer 134, second polysilicon layer 132, and the landing pad to form remaining portion 143, and stops on first polysilicon layer 124. FIG. 5A also shows formation of spacer 111. Spacer 111 protects the sidewall of second layer 132 during removal of first layer 124 inside opening 140 as described below.

FIG. 5B shows further etching through first polysilicon layer 124 above intrinsic base 108. Etching may occur in the form of wet etching or selective RIE through first polysilicon layer 124 stopping on intrinsic base 108. FIG. 5B also shows the structure after removal of spacer 111 (FIG. 5A) that served only to protect second layer 132 during etching of first layer 124. The etching leaves remaining portion 143 of the landing pad surrounded by first polysilicon layer 124 and second polysilicon layer 132.

FIG. 5C shows deposition of a third dielectric layer 180 of oxide at least within opening 140. Third dielectric layer 180 forms an oxide region 146 within opening 140. In addition, FIG. 5C shows formation of a spacer 110 to the side of opening 140 in any now known or later developed fashion, e.g., deposition and etch back of silicon nitride. The combination of a predefined thickness of third dielectric layer 180 and width of spacer 110 selectively determines the amount of self-alignment exhibited by a resulting transistor, as will be described below.

Figure 5D:
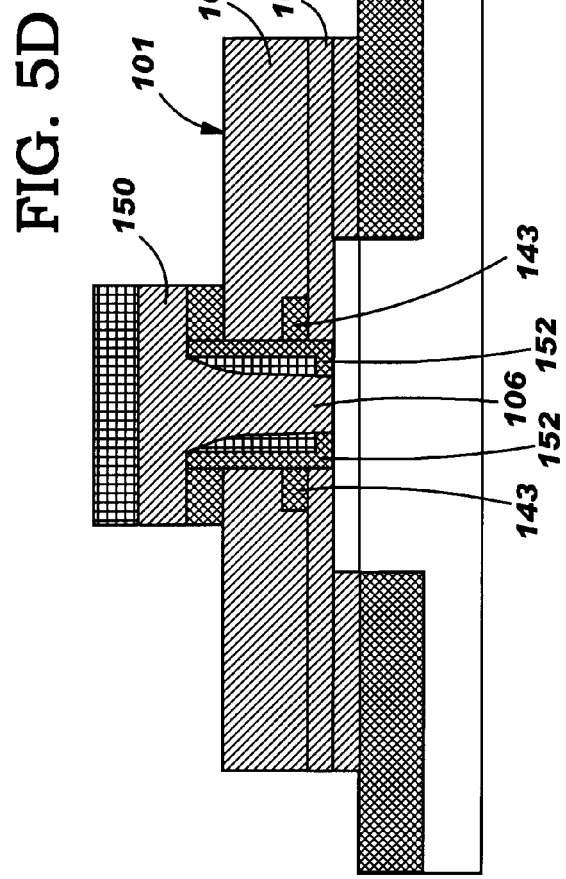
Figure 5E:
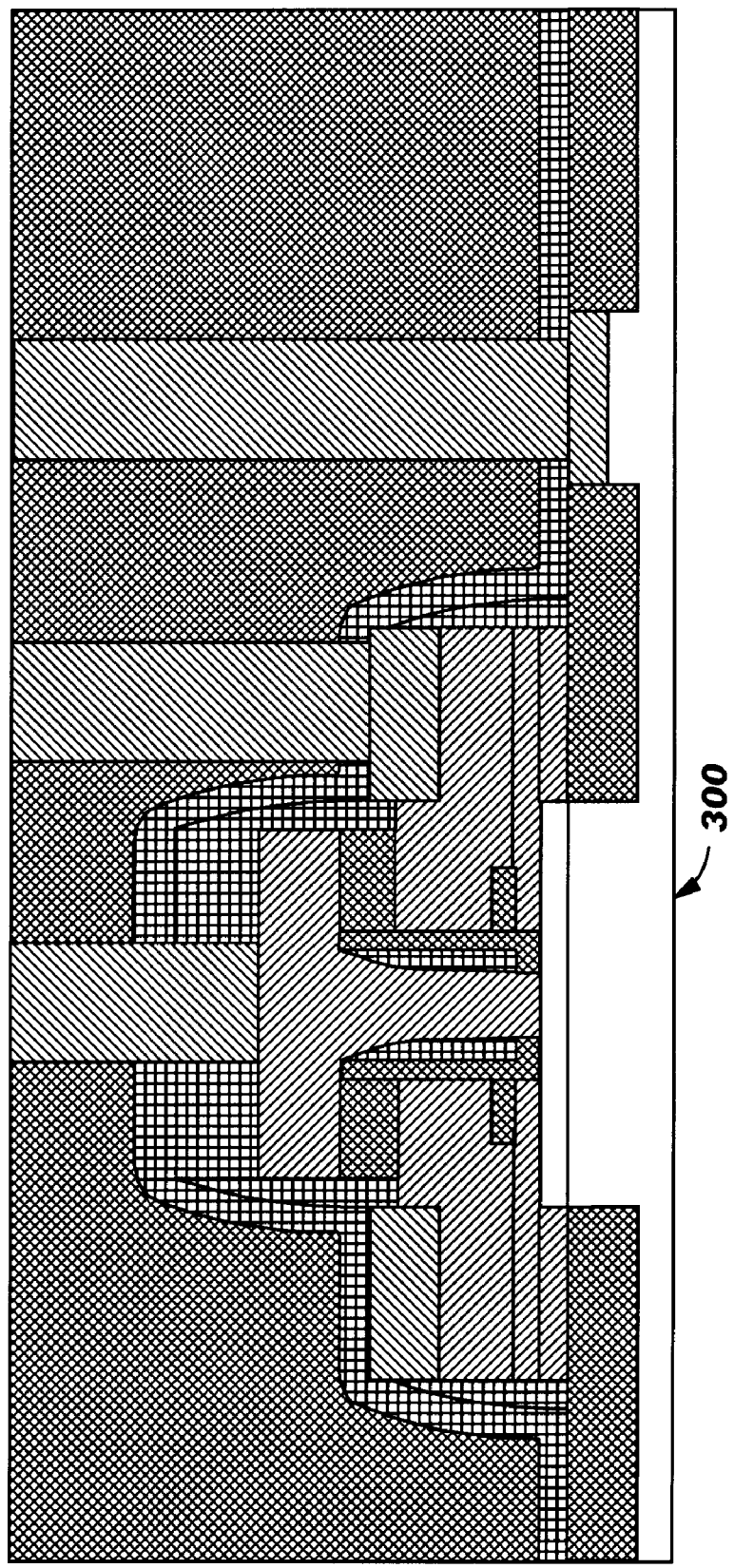

FIG. 5D shows oxide region 146 is removed within opening 140 to form an oxide section 152. Oxide section 152 is formed below remaining portion 143, but not directly under. Removal may be made by, for example, wet etching. Next, emitter polysilicon 150 is deposited and oxide section 152 determines the spacing between extrinsic base 101 (i.e., first layer 102) and emitter 106. FIG. 5D also shows structure after further steps toward completion of transistor 300 (FIG. 5E). It should be recognized that the subsequent processing shown in FIGS. 5D is merely illustrative and that other processing may be provided to form emitter 106 or otherwise finalize transistor 300 (FIG. 5E).

Referring to FIGS. 6A–6B, show how the predefined thickness (of first polysilicon layer 124, first layer 125 or combination of dielectric layer 180 and spacer 110) can be varied to select the amount of self-alignment exhibited by a resulting transistor as will now be described. It should be recognized that while the two transistors shown in FIGS. 6A and 6B, denoted 100A, 100B, respectively, are of the FIG. 2 embodiment, the discussion that follows is applicable to any embodiment. The amount of self-alignment allows for selection of performance (via base resistance) anywhere between that of a non-aligned transistor 10 (FIG. 1A) and a fully self-aligned transistor 22 (FIG. 1B) having a raised extrinsic base. FIG. 6A illustrates a thinner predefined thickness such that oxide section 152A is relatively narrow, and FIG. 6B illustrates a thicker predefined thickness such that oxide section 152B is relatively wide. Each figure also includes a conceptual base current flow line 190A, 190B, respectively. As shown in each of FIGS. 6A and 6B, current enters through emitter 106, flows through intrinsic base 108, traverses an outer extremity of oxide section 152A or 152B to extrinsic base 101 (i.e., layers 102, 104) and finally passes to silicide section 300.

As base current conceptually flows through first layer 102 in FIG. 6A as shown by line 190A, however, current must traverse remaining portion 143 of the landing pad because of where oxide section 152A ends. In this fashion, transistor 100A is "quasi-self aligned" in that the narrow oxide section 152A determines the spacing between emitter 106 and extrinsic base 101, but remaining portion 143 of the landing pad still effects current flow, i.e., the actual spacing. Since the size (width) of oxide section 152A, as determined by the predefined thickness, determines the spacing, the size also determines that part of transistor resistance associated with this structure. In particular, the width of oxide section 152A determines a current path length within intrinsic base 108 that current must traverse as it passes through extrinsic base layers 102, 104. A shorter current path in intrinsic base 108, and a shorter length of remaining portion 143, results in lower base resistance and better performance. As a result, transistor 100A of FIG. 6A exhibits better performance and lower base resistance than the prior art non-self aligned transistor 10 (FIG. 1A), but does not equal the performance and lower base resistance of a fully self-aligned transistor 22 (FIG. 1B). However as shown by line 190B in FIG. 6B, an oxide section 152B may be sized sufficiently, by increasing the predefined thickness, such that current does not have to traverse any of remaining portion 143. That is, as current flows through first layer 102 in FIG. 6B, current does not experience remaining portion 143 of the landing pad, and passes directly through extrinsic base layers 102, 104 to silicide section 300. In this fashion, transistor 100B is fully self aligned in that oxide section 152B (not remaining portion 143 of the landing pad) alone determines the actual spacing between emitter 106 and the extrinsic base (e.g., layer 102 as illustrated), and accordingly that portion of transistor resistance associated with this structure. In other words, oxide section 152B has a thickness sufficient to prevent the current from having to traverse remaining portion 143. As a result, transistor 100B of FIG. 6B exhibits better performance and lower base resistance than transistor 10 (FIG. 1A) and transistor 100A (FIG. 6A).

The invention described above provides a mechanism for a user to select the amount of self-alignment of a transistor by selecting the size of oxide section 52, 152A, 152B. It should be recognized, however, that a decision on the size of the oxide section represents a balancing of interests between performance and fabrication complexity relative to those embodiments in which polysilicon (FIGS. 3A–3I) or silicon (FIGS. 4A–4E) is oxidized. More specifically, while a larger oxide section 152B (FIG. 6B) provides for more or complete self-alignment and the corresponding performance advantages, fabrication of a thicker oxide section is more difficult in terms of oxidation of polysilicon or silicon (FIGS. 3A–3I and 4A–4E embodiments) because more oxidation must be provided to ensure: a) oxide sections 152 completely cutoff contact to emitter 106 by first layer 102, and b) oxide sections 152 are wide enough to extend below (lower than and either to or under) remaining portion 143 a sufficient distance. Problems of controlling the amount of oxidation must then be balanced relative to the desired amount of improved performance. In addition, in order to attain a uniform width of oxide sections 152, it may be necessary for emitter 106 to undercut a portion of spacer 110, as shown in FIG. 6B, which presents other fabrication concerns. The above concerns, however, are not present relative to the FIGS. 5A–5E embodiment since the self-alignment is more readily controlled via the thickness of the third dielectric layer 180 and width of spacer 110 (FIG. 5C).

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims. For example, it may be possible to attain transistors 100, 200, 300 by providing other processes. For example, it may be possible to form oxide section 152 and subsequently form the structure(s) above.

What is claimed is:

1. A transistor comprising:
a remaining portion of an emitter landing pad that is distanced from an intrinsic base, wherein the remaining portion is distanced from the intrinsic base by an extrinsic base layer, and the extrinsic base layer includes an oxide section that determines a distance between an emitter and an extrinsic base, wherein a width of the oxide section determines a base resistance.

2. The transistor of claim 1, wherein the width of the oxide section determines a length of the remaining portion that current must traverse as current passes through the extrinsic base.

3. The transistor of claim 2, wherein the thickness of the oxide section is sufficient to prevent current from having to traverse the remaining portion.

4. A transistor comprising:
an emitter;
a first extrinsic base layer;
a second extrinsic base layer electrically connected to the first extrinsic base layer;
an oxide section in the first extrinsic base layer adjacent the emitter; and a remaining portion of an emitter landing pad that separates each of the first and second extrinsic base layer from one another adjacent the emitter.

5. The transistor of claim 4, wherein the extrinsic base includes the first extrinsic base layer and a second extrinsic base layer, and the first extrinsic base layer is doped at a different concentration than the second extrinsic base layer.

6. The transistor of claim 5, wherein the oxide section is positioned within the first extrinsic base layer.

7. The transistor of claim 5, wherein the first extrinsic base layer includes a first region including a doped silicon and a second region includes a doped polysilicon, and the oxide section is in the first region.

8. The transistor of claim 4, further comprising a remaining portion of an emitter landing pad positioned above the oxide section.

9. The transistor of claim 4, wherein a width of the oxide section determines a base resistance.

10. The transistor of claim 9, wherein the width of the oxide section determines a length of the remaining portion that current must traverse as the current passes through the extrinsic base.

11. The transistor of claim 10, wherein the thickness of the oxide section is sufficient to prevent the current from having to traverse the remaining portion.

12. The transistor of claim 4, wherein the emitter extends under a portion of a spacer.

13. The transistor of claim 4, wherein the first and second extrinsic base layers extend in a horizontally overlapped fashion from the emitter to a common edge.

14. A transistor comprising:

an emitter extending through a remaining portion of an emitter landing pad to an intrinsic base; and an oxide section in an extrinsic base layer, the oxide portion extending below a part of the remaining portion, wherein a width of the oxide section determines an amount of base resistance.

15. The transistor of claim 14, wherein the thickness determines a length of the remaining portion tat current must traverse as the current passes through an extrinsic base.

16. The transistor of claim 14, wherein the extrinsic base layer extends under another part of the remaining portion and elevates the remaining portion from the intrinsic base.

17. The transistor of claim 16, wherein the extrinsic base includes a first layer and a second layer, and the oxide section is positioned within the first layer, and the first layer includes a first region including a doped silicon and a second region including a doped polysilicon.

* * * * *